(12) United States Patent
Kuwabara et al.

(10) Patent No.: US 12,708,006 B2
(45) Date of Patent: Aug. 11, 2026

(54) WIRING SUBSTRATE HAVING MULTIPLE BUILD-UP PARTS

(71) Applicant: IBIDEN CO., LTD., Ogaki (JP)

(72) Inventors: Masashi Kuwabara, Ibi-gun (JP); Susumu Kagohashi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 260 days.

(21) Appl. No.: 18/626,395

(22) Filed: Apr. 4, 2024

(65) Prior Publication Data

US 2024/0339393 A1 Oct. 10, 2024

(30) Foreign Application Priority Data

Apr. 5, 2023 (JP) ................................ 2023-061590

(51) Int. Cl.
*H10W 70/65* (2026.01)
*H10W 70/05* (2026.01)
(Continued)

(52) U.S. Cl.
CPC .......... *H10W 70/65* (2026.01); *H10W 70/05* (2026.01); *H10W 70/685* (2026.01); *H10P 72/74* (2026.01); *H10P 72/7424* (2026.01)

(58) Field of Classification Search
CPC ... H10W 70/685; H10W 70/65; H10W 70/05; H05K 1/11; H05K 1/02; H05K 1/0353; H05K 1/111; H05K 1/115; H05K 3/244; H05K 3/426; H05K 1/0306; H05K 2203/135; H10P 72/74; H10P 72/7424; G03F 7/0007; G03F 7/164; H01J 29/467; H01J 9/148
(Continued)

(56) References Cited

U.S. PATENT DOCUMENTS 4,665,468 A * 5/1987 Dohya ................ H10W 70/611
257/E23.173
6,306,265 B1 * 10/2001 Fu ....................... H01J 37/3455
204/192.12

(Continued)

FOREIGN PATENT DOCUMENTS

JP 2000-124602 A 4/2000

*Primary Examiner* — Timothy J Thompson
*Assistant Examiner* — Michael F McAllister
(74) *Attorney, Agent, or Firm* — Finnegan, Henderson, Farabow, Garrett & Dunner, LLP

(57) ABSTRACT

A wiring substrate includes a first build-up part including first insulating and conductor layers, and via conductors, and a second build-up part including second insulating and conductor layers. The minimum wiring width in the first conductor layers is smaller than the minimum wiring width in the second conductor layers. The minimum inter-wiring distance in the first conductor layers is smaller than the minimum inter-wiring distance in the second conductor layers. Each first conductor layer and each via conductor include first and second layers. The first layer includes a first portion covering respective surface of the first insulating layers, a second portion covering inner wall surface in respective via opening in the first insulating layers, and a third portion covering bottom surface in the respective via opening. The thickness of the first portion is larger than the thickness of the second portion and larger than the thickness of the third portion.

20 Claims, 15 Drawing Sheets

(51) Int. Cl.
*H10W 70/685* (2026.01)
*H10P 72/70* (2026.01)

(58) Field of Classification Search
USPC .......................................................... 174/253
See application file for complete search history.

(56) References Cited

U.S. PATENT DOCUMENTS

| | | | | |
|---|---|---|---|---|
| 9,824,989 | B2 * | 11/2017 | Shih | H10W 70/09 |
| 10,643,936 | B2 * | 5/2020 | Hu | H10P 72/74 |
| 12,309,943 | B2 * | 5/2025 | Lau | H05K 3/4688 |
| 2005/0205978 | A1 * | 9/2005 | Pu | H10W 90/00<br>257/E23.178 |
| 2008/0166869 | A1 * | 7/2008 | Chiang | H10W 20/033<br>257/E21.585 |
| 2011/0097897 | A1 * | 4/2011 | Tanaka | H10W 20/035<br>438/653 |
| 2015/0102510 | A1 * | 4/2015 | Kaneda | H05K 1/18<br>174/250 |
| 2019/0355684 | A1 * | 11/2019 | Shih | H10W 70/09 |
| 2021/0134584 | A1 * | 5/2021 | Chiu | H10P 90/124 |

* cited by examiner

FIG. 5A
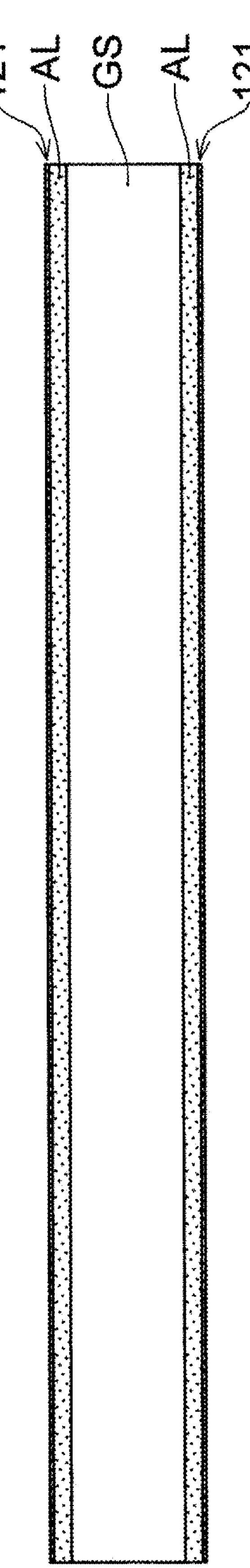
121
AL
GS
AL
121

WIRING SUBSTRATE HAVING MULTIPLE BUILD-UP PARTS

CROSS-REFERENCE TO RELATED APPLICATIONS

The present application is based upon and claims the benefit of priority to Japanese Patent Application No. 2023-061590, filed Apr. 5, 2023, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2000-124602 describes a printed wiring board that includes a conductor layer, a resin insulating layer that covers the conductor layer, a conductor circuit that is formed on the resin insulating layer and a via hole that penetrates the resin insulating layer and connects the conductor circuit and the conductor layer. The entire contents of this publication are incorporated herein by reference.

SUMMARY OF THE INVENTION

According to one aspect of the present invention, a wiring substrate includes a first build-up part including first insulating layers, first conductor layers, and via conductors, and a second build-up part including second insulating layers and second conductor layers and formed such that the first build-up part is laminated on the second build-up part, that the minimum wiring width of wirings in the first conductor layers is smaller than the minimum wiring width of wirings in the second conductor layers, and that the minimum inter-wiring distance of the wirings in the first conductor layers is smaller than the minimum inter-wiring distance of the wirings in the second conductor layers. Each of the first conductor layers and via conductors includes a first layer and a second layer formed on the first layer such that the first layer includes a first portion covering a respective surface of the first insulating layers, a second portion covering an inner wall surface in a respective via opening in the first insulating layers, and a third portion covering a bottom surface in the respective via opening in the first insulating layers and that the thickness of the first layer in the first portion is larger than the thickness of the first layer in the second portion and larger than the thickness of the first layer in the third portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5A illustrates an example of a method for manufacturing a wiring substrate according to an embodiment of the present invention;

FIG. 5K illustrates an example of a method for manufacturing a wiring substrate according to an embodiment of the present invention; and FIG. 5L illustrates an example of a method for manufacturing a wiring substrate according to an embodiment of the present invention.

DETAILED DESCRIPTION OF THE EMBODIMENTS

Figure 1:
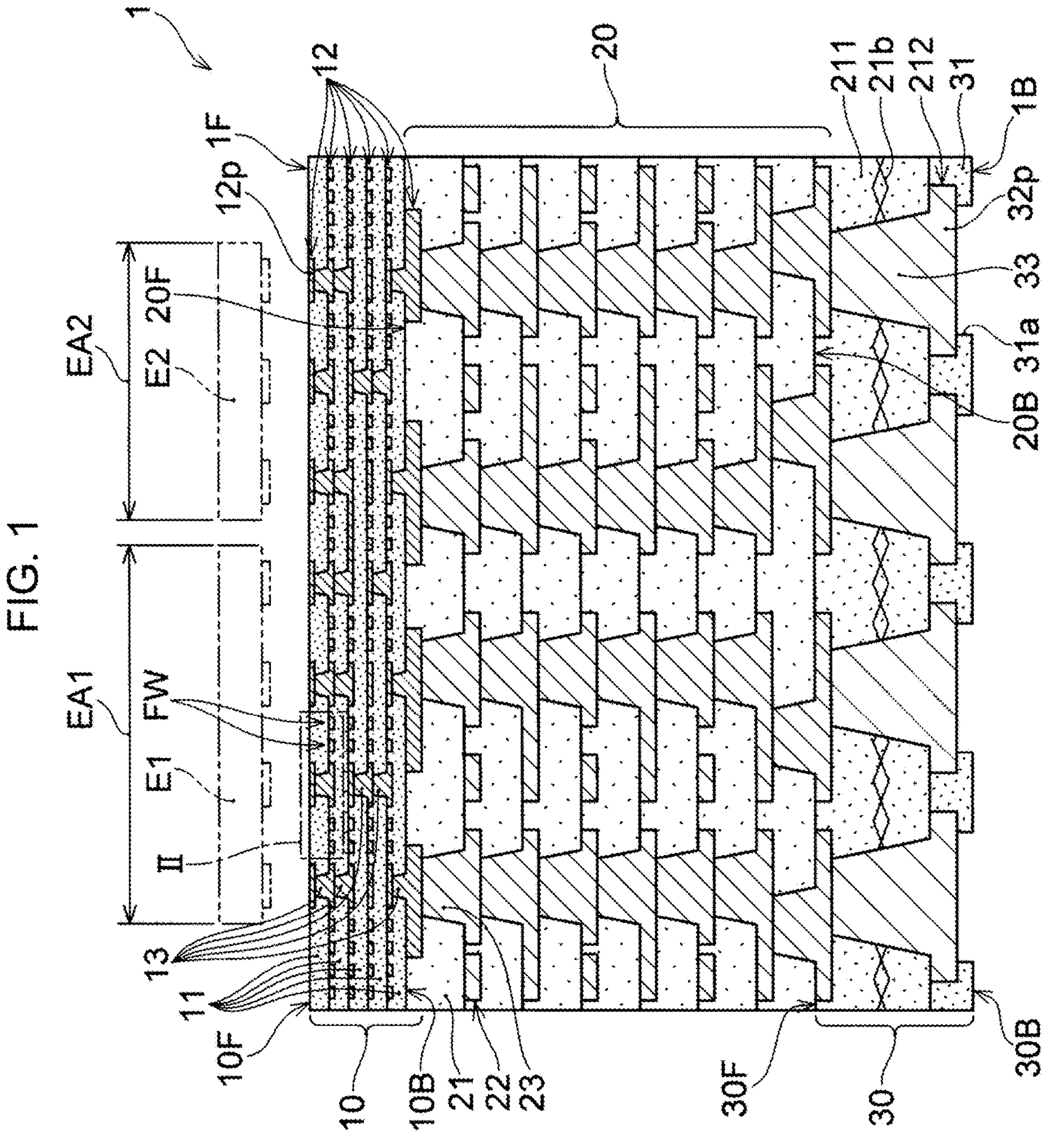
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

A wiring substrate according to an embodiment of the present invention is described with reference to the drawings. FIG. 1 is a cross-sectional view illustrating a wiring substrate 1 as an example of a wiring substrate according to an embodiment of the present invention. A laminated structure, the number of conductor layers and the number of insulating layers of a wiring substrate according to an embodiment of the present invention are not limited to the laminated structure of the wiring substrate 1 in FIG. 1, the number of conductor layers and the number of insulating layers in the wiring substrate 1.

The wiring substrate 1 of the embodiment has a laminated structure that includes a first build-up part 10 and a second build-up part 20, which are each formed of alternately laminated conductor layers and insulating layers. The first build-up part 10 has, as two surfaces orthogonal to a thickness direction (lamination direction) thereof, one surface (10F) and the other surface (10B) on the opposite side with respect to the one surface (10F). The second build-up part 20 has, as two surfaces orthogonal to a thickness direction (lamination direction) thereof, one surface (20F) and the other surface (20B) on the opposite side with respect to the one surface (20F). The wiring substrate 1 has two surfaces (a first surface (1F) and a second surface (1B) on the opposite side with respect to the first surface (1F)) orthogonal to a thickness direction thereof. The wiring substrate 1 of the present embodiment is preferably a coreless wiring substrate that does not include a core layer.

In the example illustrated in FIG. 1, the wiring substrate 1 further includes a third build-up part 30, which is formed of an insulating layer and a conductor layer, on a side opposite to the first build-up part 10 side of the second build-up part 20. The third build-up part 30 has, as two surfaces orthogonal to a thickness direction (lamination direction) thereof, one surface (30F) and the other surface (30B) on the opposite side with respect to the one surface (30F). In the illustrated example, the one surface (10F) of the first build-up part 10 forms the first surface (1F), and the other surface (30B) of the third build-up part 30 forms the second surface (1B). When the wiring substrate 1 does not have the third build-up part 30, the second surface (1B) can be formed by the other surface (20B) of the second build-up part 20.

The first build-up part 10 includes relatively fine wirings and can have relatively dense circuit wirings. In the example of FIG. 1, the first build-up part 10 includes alternately laminated insulating layers 11 (first insulating layers 11) and conductor layers 12 (first conductor layers 12). Conductor layers 12 facing each other with one first insulating layer 11 in between are connected by via conductors 13 (first via conductors 13).

As illustrated, the via conductors 13 are formed to each have a tapered shape that is reduced in diameter from the other surface (10B) toward the one surface (10F) of the first build-up part 10. Here, for convenience, the term "reduced in diameter" is used. However, the shape of each of the via conductors 13 is not necessarily limited to a circular shape. The term "reduced in diameter" means that a diameter (a longest distance between two points on an outer circumference of a horizontal cross section) of each of the via conductors 13 is reduced. A via diameter of each of the via conductors 13 (a diameter of each of the via conductors 13 at a surface in contact with the conductor layer 12 on the other surface (10B) side of the each of the via conductors 13) can be about 10 μm.

The one surface (10F) of the first build-up part 10 is formed of a surface of a first conductor layer 12 and a surface of a first insulating layer 11 exposed from patterns of the first conductor layer 12. The first conductor layers 12 are each patterned to have predetermined conductor patterns. In the illustrated example, the first conductor layer 12 forming the one surface (10F) is formed to have patterns including multiple conductor pads (12*p*). As illustrated, the conductor layer 12 that forms the other surface (10B) of the first build-up part 10 and is in contact with the second build-up part 20 may have a thickness different from the other conductor layers 12 of the first build-up part 10.

The conductor pads (12*p*) form the outermost surface (first surface (1F)) of the wiring substrate 1 and form a component mounting surface of the wiring substrate 1 to which external electronic components can be connected. The component mounting surface of the wiring substrate 1 can have multiple component mounting regions. For example, as illustrated in the example of FIG. 1, two component mounting regions (EA1, EA2) can be formed corresponding to regions where electronic components (E1, E2) are to be mounted. In mounting external electronic components to the wiring substrate 1 in the illustrated example, the exposed conductor pads (12*p*) can be electrically and mechanically connected to the external electronic components, for example, via a conductive bonding material such as solder (not illustrated) interposed between the conductor pads (12*p*) and connection pads of the external electronic components. In this case, for example, a plating layer (not illustrated) or the like including a nickel layer and a tin layer may be formed in advance on surfaces of the conductor pads (12*p*). When the multiple component mounting regions are formed, conductor patterns may be formed in the conductor layers 12 in the first build-up part 10 such that conductor pads (12*p*) positioned in adjacent component mounting regions can be electrically connected to each other. In using the wiring substrate 1, multiple electronic components to be mounted can be electrically connected to each other via the first build-up part 10 in short paths. As a result, in using the wiring substrate 1, it may be possible to improve flexibility in designing circuits via multiple electronic components that can be mounted.

Examples of the electronic components (E1, E2) that can be mounted on the wiring substrate 1 include electronic components such as active components such as semiconductor integrated circuit devices and transistors. Specifically, for example, the electronic components can each be an integrated circuit such as a logic chip incorporating a logic circuit, a processing unit such as an MPU (Micro Processor Unit), or a memory element such as an HBM (High Bandwidth Memory).

The first insulating layers 11 of the first build-up part 10 can be formed, for example, using an insulating resin such as an epoxy resin or a phenol resin. The first insulating layers 11 may contain one of a fluorine resin, a liquid crystal polymer (LCP), a fluoroethylene resin (PTFE), a polyester resin (PE), and a modified polyimide resin (MPI).

Examples of conductors forming the first conductor layers 12 and the first via conductors 13 include copper, nickel, and the like, and copper is preferably used. In the example illustrated in FIG. 1, the first conductor layers 12 and the first via conductors 13 are each illustrated as having a single-layer structure. However, the first conductor layers 12 and the first via conductors 13 can each have a multilayer structure. For example, as will be described later in detail with reference to FIGS. 2A and 2B, the first conductor layers 12 and the first via conductors 13 can each have a multilayer structure that includes a metal film layer (preferably a sputtering film layer) and a plating film layer (preferably an electrolytic plating film layer).

The first conductor layers 12 can have fine wirings (FW), which are high-density wirings with relatively small wiring widths and inter-wiring distances (shortest distances between adjacent wirings). The fine wirings (FW) can have smallest pattern widths and inter-pattern distances among wirings of the wiring substrate 1. In the illustrated example, among the multiple first conductor layers 12 included in the first build-up part 10, four conductor layers 12 have fine wirings (FW), which are high-density wirings. However, the number of the first conductor layers 12 having fine wirings (FW) in the first build-up part 10 is not limited.

The fine wirings (FW) included in the first build-up part 10 have smaller wiring widths and inter-wiring distances than wiring widths and inter-wiring distances of wirings included in conductor layers 22 (second conductor layers 22) in the second build-up part 20 to be described later. Specifically, for example, the fine wirings (FW) have a minimum wiring width of 3 μm or less and a minimum inter-wiring distance of 3 μm or less. Since the first build-up part 10 has the fine wirings (FW), it may be possible to provide wirings with more appropriate characteristics for electrical signals that can be transmitted via the wirings in the first build-up part 10. Further, it is thought that it may be possible to increase a density of the wirings in the first build-up part 10 and to improve a degree of freedom in wiring design. From the same point of view, an aspect ratio of the fine wirings (FW) can be, for example, 2.0 or more and 4.0 or less.

The first conductor layers 12 that include the fine wirings (FW) in the first build-up part 10 can each have a thickness of, for example, 7 μm or less. The first insulating layers 11 in the first build-up part 10 each have a thickness of, for example, about 7.5-10 μm. In this case, the first insulating layers 11 preferably do not each contain a core material (reinforcing material) formed of a glass fiber, an aramid fiber, or the like.

As illustrated in FIG. 1, the first build-up part 10 is in contact with the one surface (20F) side of the second build-up part 20. That is, the other surface (10B) of the first build-up part 10, which is formed of surfaces of an insulating layer 11 and a conductor layer 12, faces the one surface (20F) of the second build-up part 20. Similar to the first build-up part 10, the second build-up part 20 includes alternately laminated insulating layers 21 (second insulating layers 21) and conductor layers 22 (second conductor layers). Via conductors 23 penetrating the second insulating layers 21 are formed in the second insulating layers 21. The conductor layers 22 are each patterned to have predetermined conductor patterns. As illustrated in FIG. 1, the second build-up part 20 does not include a core layer.

As illustrated in FIG. 1, in the wiring substrate 1, the third build-up part 30 may be further laminated on the other surface (20B) side of the second build-up part 20. The other surface (20B) of the second build-up part 20, which is formed of a surface of a second conductor layer 22 and a surface of a second insulating layer 21 exposed from patterns of the second conductor layer 22, faces the one surface (30F) of the third build-up part 30. The third build-up part 30 includes an insulating layer 211 (third insulating layer 211) and a conductor layer 212 (third conductor layer 212). In the insulating layer 211, via conductors 33 are formed that penetrate the insulating layer 211 and connect the conductor layer 212 and the conductor layer 22 that forms the other surface (20B) of the second build-up part 20.

In the example of FIG. 1, the third build-up part 30 further includes a solder resist layer 31 that covers surfaces of the insulating layer 211 and the conductor layer 212. The solder resist layer 31 is formed using, for example, a photosensitive polyimide resin or epoxy resin. Openings (31*a*) are formed in the solder resist layer 31, and conductor pads (32*p*) of the conductor layer 212 are exposed from the openings (31*a*).

The insulating layers 21 of the second build-up part 20 can be formed using an insulating resin similarly to the insulating layers 11. The insulating layers (11, 21) in the build-up parts may contain the same insulating resin or insulating resins different from each other. The insulating layers 21 may each contain a core material (reinforcing material) formed of a glass fiber or an aramid fiber. In the illustrated example, the insulating layer 211 of the third build-up part 30 contains a core material (21*b*) formed of a glass fiber. The insulating layers (21, 211) can each further contain an inorganic filler formed of fine particles of silica ($SiO_2$), alumina, mullite, or the like.

Similar to the conductor layers 12 and the via conductors 13, the conductor layers 22 of the second build-up part 20 and the conductor layer 212 of the third build-up part 30, as well as the via conductors (23, 33), can be formed using any metal such as copper or nickel. As illustrated in FIG. 1, similar to the via conductors 13 in the first build-up part 10, the via conductors 23 included in the second build-up part 20 and the via conductors 33 included in the third build-up part 30 are formed to each have a tapered shape that is reduced in diameter from the second surface (1B) side toward the first surface (1F) side of the wiring substrate 1.

Wiring widths and inter-wiring distances of wirings included in the second conductor layers 22 of the second build-up part 20 and the third conductor layer 212 of the third build-up part 30 are larger than the wiring widths and the inter-wiring distances of the wirings included in the first conductor layers 12 of the first build-up part 10. The second conductor layers 22 are formed thicker than the first conductor layers 12, and each have a thickness of, for example, about 10 μm or more. The second conductor layers 22 of the second build-up part 20 do not include wiring patterns that are as fine as the fine wirings (FW) of the first build-up part 10. For example, the wirings included in the second conductor layers 22 have a minimum wiring width of about 4 μm and a minimum inter-wiring distance of about 6 μm. An aspect ratio of the wirings included in the second conductor layers 22 may be substantially the same as the aspect ratio of the fine wirings (FW) of the conductor layers 12, for example, about 2.0 or more and 4.0 or less. A via diameter of each of the via conductors 23 (a diameter of each of the via conductors 23 at a surface in contact with the conductor layer 22 on the other surface (20B) side of the each of the via conductors 23) is about 50 μm.

In the illustrated wiring substrate 1, for example, the insulating layer 211 and the conductor layer 212 of the third build-up part 30 are both formed thicker than the insulating layers 21 and the conductor layers 22 in the second build-up part 20. For example, the insulating layer 211 has a thickness of about 100 μm or more and 200 μm or less. Further, the conductor layer 212 has a thickness of about 20 μm. A via diameter of each of the via conductors 33 (a diameter of each of the via conductors 3 at a surface in contact with the conductor layer 212 on the other surface (30B) side of the each of the via conductors 33) is about 100 μm.

Similar to the first conductor layers 12 and the first via conductors 13, the conductor layers (22, 212) and the via conductors (23, 33) may be formed to each have a multilayer structure, for example, can each have a multilayer structure that includes a metal film layer (preferably a sputtering film layer or an electroless plating film layer) and a plating film layer (preferably an electrolytic plating film layer). The second build-up part 20 and the third build-up part 30 do not include fine wiring patterns such as the fine wirings (FW) of the first build-up part 10. In such a case, of the multilayer structure of each of the conductor layers 22 and the via conductors 23, as well as the conductor layer 212 and the via conductors 33, the metal film layer can be an electroless plating film layer formed by an electroless plating film, in particular, an electroless copper plating film layer, and the plating film layer can be an electrolytic plating film layer formed by an electrolytic plating film, in particular, an electrolytic copper plating film layer.

The second surface (1B) of the wiring substrate 1 on the opposite side with respect to the component mounting surface of the wiring substrate 1 can be a connection surface that is to be connected to an external element such as an external wiring substrate (for example, a motherboard of any electrical device) when the wiring substrate 1 itself is mounted on the external element. The conductor pads (32*p*) can be connected to any substrate, electrical component, mechanism component, or the like.

Figure 2:
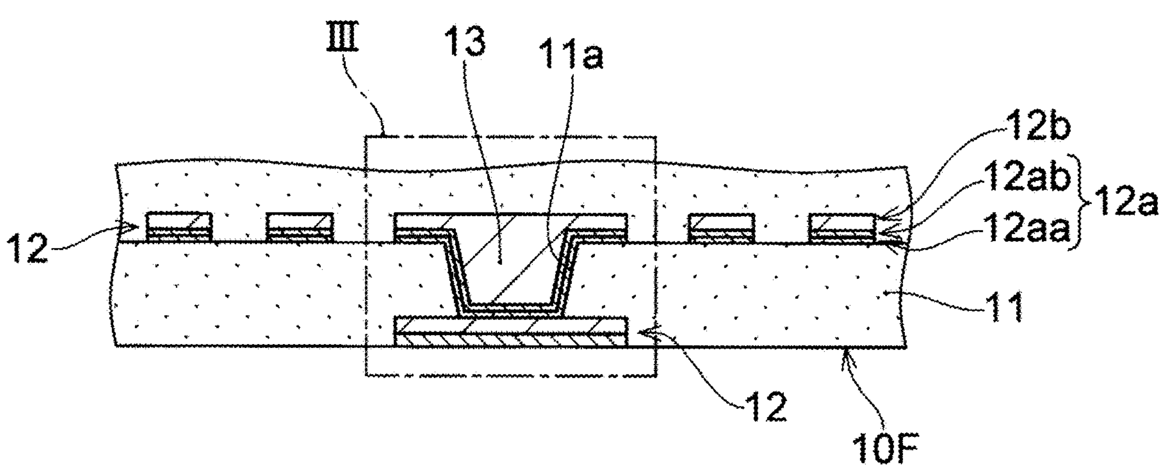
FIG. 2 is a partial enlarged view of FIG. 1 illustrating an example of a wiring substrate according to an embodiment of the present invention.
Figure 3:
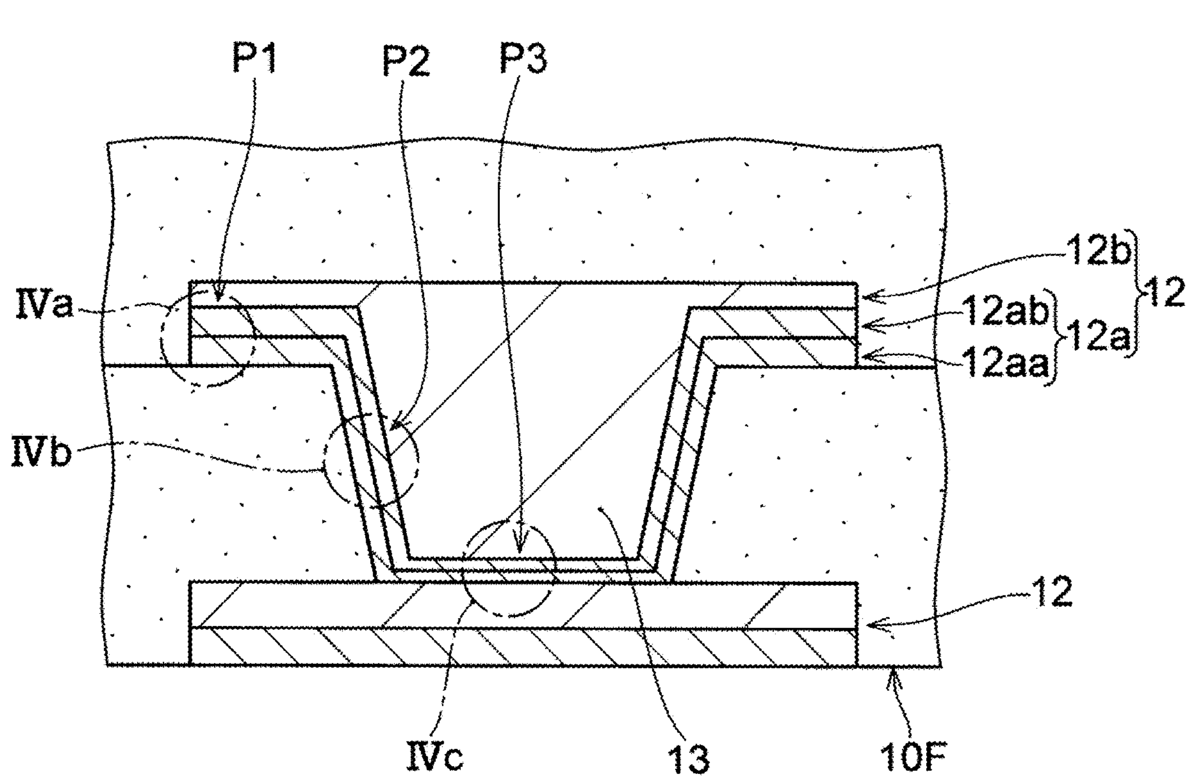
FIG. 3 is a partial enlarged view of FIG. 1 illustrating an example of a wiring substrate according to an embodiment of the present invention.
Figure 4A:
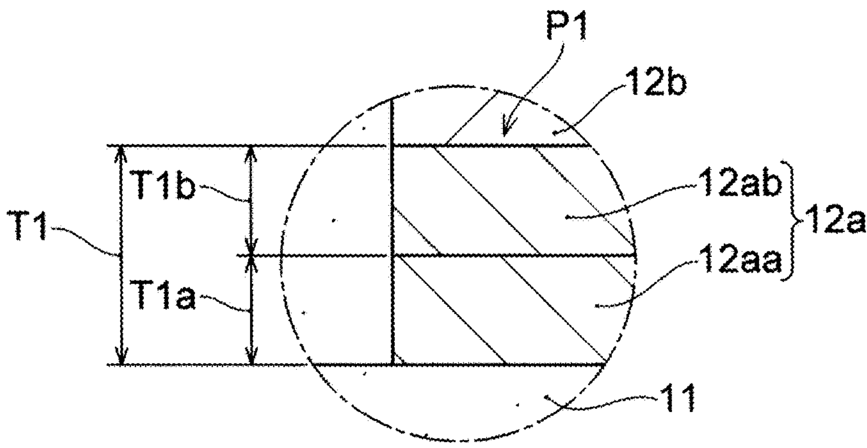
FIG. 4A is a partial enlarged view of FIG. 3 illustrating an example of a wiring substrate according to an embodiment of the present invention.
Figure 4B:
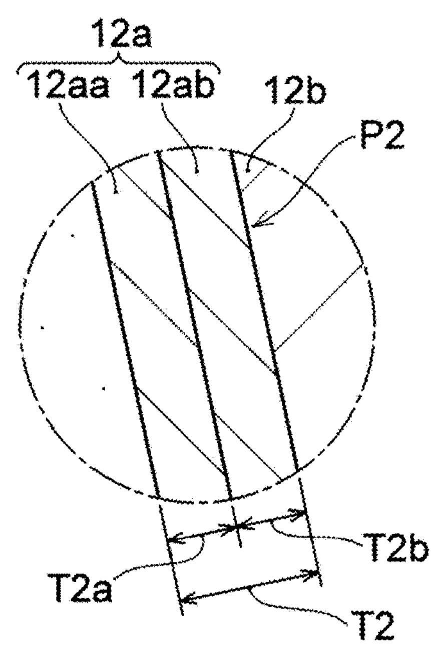
FIG. 4B is a partial enlarged view of FIG. 3 illustrating an example of a wiring substrate according to an embodiment of the present invention.
Figure 4C:
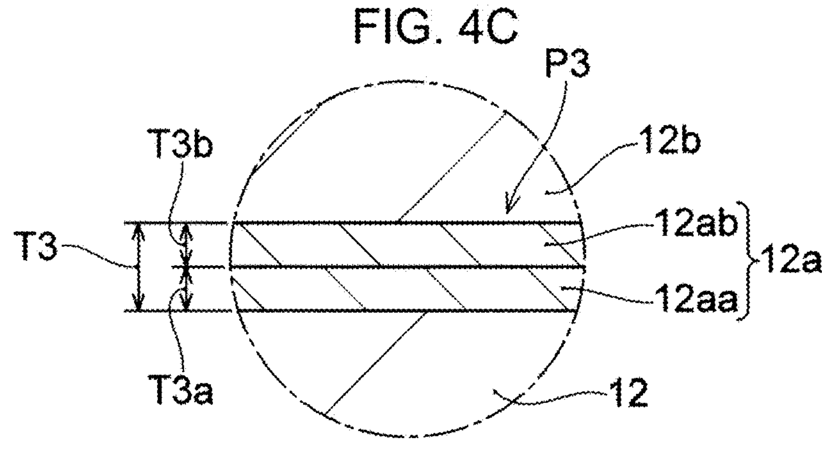
FIG. 4C is a partial enlarged view of FIG. 3 illustrating an example of a wiring substrate according to an embodiment of the present invention.

Next, with reference to FIG. 2 (which is an enlarged view of a region (II) surrounded by a one-dot chain line in FIG. 1), FIG. 3 (which is an enlarged view of a region (III) surrounded by a one-dot chain line in FIG. 2), and FIGS. 4A, 4B and 4C (which are respectively enlarged views of regions (IVa, IVb, IVc) surrounded by one-dot chain lines in FIG. 3), a first conductor layer 12 in the first build-up part 10, and a first via conductor 13 integrally formed with the first conductor layer 12 will be described in detail. In FIGS. 2 and 3, the up-down direction (the thickness direction of the wiring substrate 1) is reversed compared to FIG. 1, with the one surface (10F) positioned on a lower side in the drawing and the other surface (10B) positioned on an upper side. Hereinafter, in describing the wiring substrate 1 with reference to FIGS. 2-4C, the one surface (10F) side is referred to as "lower" or a "lower side" and the other surface (10B) side is referred to as "upper" or an "upper side."

As illustrated in FIG. 2, a via opening (11*a*) penetrating the first insulating layer 11 is formed in the first insulating layer 11. The first via conductor 13 that connects first conductor layers 12 facing each other with the first insulating layer 11 in between is formed by filling the via opening (11*a*) with a conductor. For example, the via opening (11*a*) can be formed such that an aspect ratio of the via conductor 13 ((height from an upper surface of the lower conductor layer 12 to a lower surface of the upper conductor layer, which are in contact with the via conductor 13)/(diameter of the via conductor 13 at the upper surface of the lower conductor layer 12)) is about 0.5 or more and about 1.0 or less. Specifically, as illustrated, a first layer (12*a*) (which can be a metal film layer formed by sputtering) and a second layer (12*b*) (which can be an electrolytic plating film layer) that form the first conductor layer 12 fill the via opening (11*a*) to form the first via conductor 13. The first conductor layer 12 and the first via conductor 13 are integrally formed. The via opening (11*a*) formed in the first insulating layer 11 is also referred to as a first via opening (11*a*).

The first layer (12*a*) covers a part of an upper surface of the first insulating layer 11 and entire inner wall surface and bottom surface of the via opening (11*a*). The first layer (12*a*) can function as a power feeding layer when the second layer (12*b*) is formed by electrolytic plating. In the illustrated example, the first layer (12*a*) has a two-layer structure including a lower layer (12*aa*) and an upper layer (12*ab*). The lower layer (12*aa*) can be a copper alloy sputtering film layer formed by sputtering using an alloy containing copper (for example, a content of copper in the copper alloy is 90 wt % or more) as a target. The upper layer (12*ab*) can be a copper sputtering film layer formed by sputtering using copper as a target. When the first layer (12*a*) that covers the inner wall surface of the via opening (11*a*) has the structure that includes the lower layer (12*aa*) and the upper layer (12*ab*), it may be possible that adhesion between the inner wall surface of the via opening (11*a*) and the first layer (12*a*) (that is, adhesion between the inner wall surface of the via opening (11*a*) and the first via conductor 13) is improved. In particular, when the lower layer (12*aa*) is a copper alloy sputtering film layer as described above, the inner wall surface of the via opening (11*a*) and the lower layer (12*aa*) can have relatively good adhesion.

It may be possible that the upper surface of the first conductor layer 12 is a highly flat polished surface with relatively small roughness. Since the surface of the conductor layer 12 is a polished surface with relatively small roughness, it may be possible that good high-frequency transmission characteristics can be obtained in the first build-up part 10. As illustrated in FIG. 3, the first layer (12*a*) forming the first conductor layer 12 and the first via conductor 13 has a first portion (P1) formed on the surface of the first insulating layer 11, a second portion (P2) formed on the inner wall surface of the first via opening (11*a*), and a third portion (P3) formed on the bottom surface of the first via opening (11*a*). FIG. 4A is an enlarged view of the region (IVa) surrounded by the one-dot chain line corresponding to the first portion (P1). FIG. 4B is an enlarged view of the region (IVb) surrounded by the one-dot chain line corresponding to the second portion (P2). FIG. 4C is an enlarged view of the region (IVc) surrounded by the one-dot chain line corresponding to the third portion (P3). As illustrated, a thickness (T1) of the first layer (12*a*) in the first portion (P1) is larger than a thickness (T2) of the first layer (12*a*) in the second portion (P2), and is larger than a thickness (T3) of the first layer (12*a*) in the third portion (P3). Further, the thickness (T2) of the first layer (12*a*) in the second portion (P2) is larger than the thickness (T3) of the first layer (12*a*) in the third portion (P3).

In other words, on an inner surface (the inner wall surface and bottom surface) of the first via opening (11*a*), the first layer (12*a*) is formed relatively thin. It may be possible that a stress is likely to concentrate near a bottom part (the first via opening (11*a*)) of the first via conductor 13 filling the first via opening (11*a*). Since the first layer (12*a*) is relatively thin on the inner surface (inner wall surface and bottom surface) of the first via opening (11*a*), it may be possible that stress concentration at an interface between the first layer (12*a*) and the inner surface of the first via opening (11*a*) and at an interface between the first layer (12*a*) and the second layer (12*b*) in the first via opening (11*a*) is suppressed and occurrence of peeling is suppressed. Connection reliability between the first via conductor 13 and the conductor layer 12 that forms the bottom surface of the first via opening (11*a*) can be improved. Further, since the first layer (12*a*) is formed relatively thick on the surface of the first insulating layer 11, it may be possible that relatively good adhesion between the first insulating layer 11 and the first layer (12*a*) is achieved.

As illustrated, a thickness (T1*a*) of the lower layer (12*aa*) in the first portion (P1) is larger than a thickness (T2*a*) of the lower layer (12*aa*) in the second portion (P2) and is larger than a thickness (T3*a*) of the lower layer (12*aa*) in the third portion (P3). Further, a thickness (T1*b*) of the upper layer (12*ab*) in the first portion (P1) is larger than a thickness (T2*b*) of the upper layer (12*ab*) in the second portion (P2), and is larger than a thickness (T3*b*) of the upper layer (12*ab*) in the third portion (P3).

Further, the thickness (T2*a*) of the lower layer (12*aa*) in the second portion (P2) is larger than the thickness (T3*a*) of the lower layer (12*aa*) in the third portion (P3). Further, the thickness (T2*b*) of the upper layer (12*ab*) in the second portion (P2) is larger than the thickness (T3*b*) of the upper layer (12*ab*) in the third portion (P3).

For example, the thickness (T1) of the first layer (12*a*) in the first portion (P1) is 0.02 μm or more and 1.0 μm or less.

For example, the thickness (T1*a*) of the lower layer (12*aa*) in the first portion (P1) is 0.01 μm or more and 0.5 μm or less. For example, the thickness (T1*b*) of the upper layer (12*ab*) in the first portion (P1) is 0.01 μm or more and 0.9 μm or less.

For example, the thickness (T2) of the first layer (12*a*) in the second portion (P2) is 0.006 μm or more and 0.6 μm or less. For example, the thickness (T2*a*) of the lower layer (12*aa*) in the second portion (P2) is 0.003 μm or more and 0.3 μm or less. For example, the thickness (T2*b*) of the upper layer (12*ab*) in the second portion (P2) is 0.003 μm or more and 0.6 μm or less. From a point of view of suppressing transmission loss in the first via conductor 13, it is preferable that the thickness of the first layer (12*a*) in the second portion (P2) is 30% or more and 60% or less of the thickness of the first layer (12*a*) in the first portion (P1), while maintaining a ratio of the thicknesses between the lower layer (12*aa*) and the upper layer (12*ab*) substantially constant.

For example, the thickness (T3) of the first layer (12*a*) in the third portion (P3) is 0.005 μm or more and 0.4 μm or less. For example, the thickness (T3*a*) of the lower layer (12*aa*) in the third portion (P3) is 0.002 μm or more and 0.2 μm or less. For example, the thickness (T3*b*) of the upper layer (12*ab*) in the third portion (P3) is 0.002 μm or more and 0.4 μm or less. From a point of view of suppressing resistance at the bottom part of the first via conductor 13, it is preferable that the thickness of the first layer (12*a*) in the third portion (P3) is 25% or more and 40% or less of the thickness of the first layer (12*a*) in the first portion (P1), while maintaining a ratio of the thicknesses between the lower layer (12*aa*) and the upper layer (12*ab*) substantially constant.

Next, with reference to FIGS. 5A-5L, a method for manufacturing a wiring substrate according to an embodiment of the present invention is described using a case where the wiring substrate 1 illustrated in FIG. 1 is manufactured as an example. Structural elements formed in the manufacturing method to be described below can be formed using the materials exemplified as the materials of the corresponding structural elements in the description of the wiring substrate 1 in FIG. 1, unless otherwise specified. In the following description about the method for manufacturing the wiring structure 1, a side closer to a support substrate (GS) is referred to as "lower" or a "lower side," and a side farther from the support substrate (GS) is referred to as "upper" or an "upper side." Therefore, of each of the elements of the wiring structure 1, a surface facing the support substrate (GS) is referred to as a "lower surface," and a surface facing the opposite side with respect to the support substrate (GS) is also referred to as an "upper surface." The wiring substrate 1 can be formed by manufacturing the first build-up part 10 on the support substrate (GS), and manufacturing the second build-up part 20 on the first build-up part 10 and the third build-up part 30 on the second build-up part 20 (see FIG. 1).

First, as illustrated in FIG. 5A, the support substrate (GS) having good surface flatness, such as a glass substrate, is prepared. On both sides of the support substrate (GS), a metal film layer 121 is formed via an adhesive layer (AL) containing, for example, an azobenzene-based polymer adhesive that can be attached or detached by irradiation with light. The metal film layer 121 is, for example, a metal film (preferably copper film) layer formed by electroless plating or sputtering or the like. It is also possible that the metal film layer 121 is formed of a relatively thin metal foil.

Figure 5B:
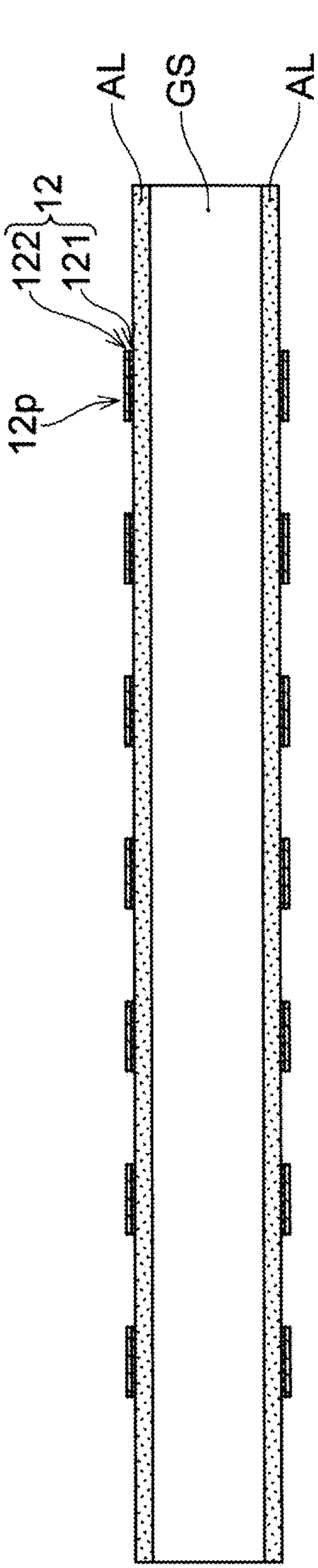
FIG. 5B illustrates an example of a method for manufacturing a wiring substrate according to an embodiment of the present invention.

Next, as illustrated in FIG. 5B, a conductor layer 12 that has multiple conductor pads (12*p*) and includes the metal film layer 121 and a plating film layer 122 is formed via the adhesive layer (AL) on the support substrate (GS). In forming the conductor layer 12, for example, a plating resist is formed on the metal film layer 121, and openings are formed in the plating resist according to formation regions of patterns of the conductor pads (12*p*), for example, by photolithography. Next, the plating film layer 122 is formed in the openings by electrolytic plating using the metal film layer 121 as a seed layer. After the formation of the plating film layer 122, the plating resist is removed, and the metal film layer 121 exposed by the removal of the plating resist is etched and the state illustrated in FIG. 5B is formed.

Figure 5C:
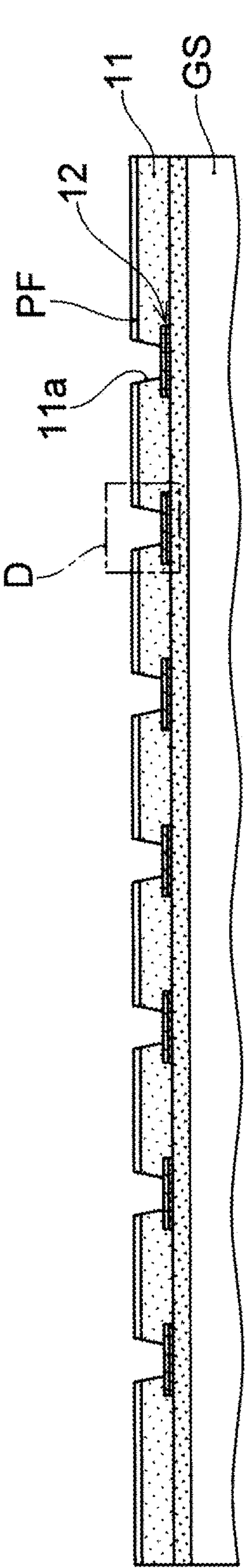
FIG. 5C illustrates an example of a method for manufacturing a wiring substrate according to an embodiment of the present invention.

Next, as illustrated in FIG. 5C, an insulating layer 11 covering the conductor layer 12 is laminated. As the insulating layer 11, for example, an insulating resin such as an epoxy resin or a phenol resin can be used. A fluorine resin, a liquid crystal polymer (LCP), a fluoroethylene resin (PTFE), a polyester resin (PE), or a modified polyimide resin (MPI) also may be used. The insulating layer 11 can be formed by thermocompressing these resins molded into a film-like shape onto the conductor layer 12. On the insulating layer 11, a protective film (PF) completely covering the upper surface of the insulating layer 11 is formed. The protective film (PF) is, for example, a film formed of polyethylene terephthalate (PET). A release agent can be interposed between the protective film (PF) and the upper surface of the insulating layer 11.

Next, via openings (11*a*) are formed at formation positions of via conductors 13 (see FIG. 1) in the insulating layer 11, for example, by irradiation with $CO_2$ laser, excimer laser, or the like. The via openings (11*a*) penetrating the protective film (PF) and the insulating layer 11 are formed. The via openings (11*a*) can each be formed in a shape that is reduced in diameter from the upper surface of the insulating layer 11 toward a bottom surface (the upper surface of the conductor layer 12). After the formation of the via openings (11*a*) using laser, inner surfaces (bottom surfaces and inner wall surfaces) of the via openings (11*a*) can be subjected to a desmear treatment. The desmear treatment is preferably performed with a dry desmear treatment using a plasma gas (for example, containing tetrafluoromethane). The desmear treatment also can be performed while the surface of the insulating layer 11 is protected with the protective film (PF) having been formed on the surface of the insulating layer 11. After the desmear treatment in the via opening (11*a*), the protective film (PF) is removed from the upper surface of the insulating layer 11

In FIGS. 5C-5L, the laminate formed on the surface on one side of the support substrate (GS) is illustrated, and illustration of the laminate that can be formed on the surface on the opposite side is omitted. However, on the surface on the opposite side, conductor layers and insulating layers may be formed in the same manner and number as those on the surface on the one side or in different manner and number from those on the surface on the one side, or it is also possible that such conductor layers and insulating layers are not formed.

Figure 5D:
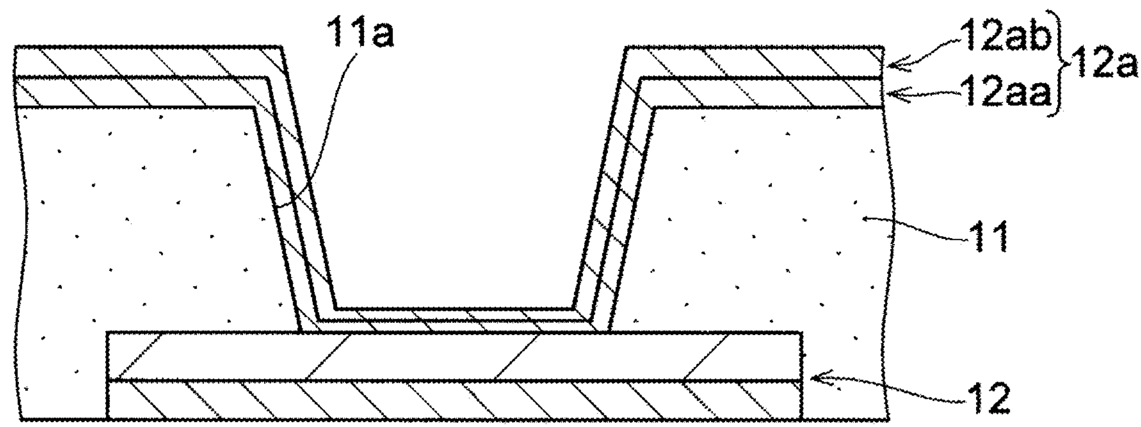
FIG. 5D illustrates an example of a method for manufacturing a wiring substrate according to an embodiment of the present invention.

Next, as illustrated in FIG. 5D (which corresponds to a region (D) surrounded by a one-dot chain line in FIG. 5C), a first layer (12*a*) forming a conductor layer 12 (see FIG. 5F) is formed by sputtering on the inner wall surface of the via opening (11*a*) and on the upper surface of the insulating layer 11. Specifically, first, a lower layer (12*aa*) is formed by sputtering on the upper surface of the insulating layer 11, on the inner wall surface of the via opening (11*a*), and on the upper surface of the conductor layer 12 that forms the bottom surface of the via opening (11*a*). The lower layer (12_aa_) is formed by sputtering using an alloy containing copper (for example, a content of copper in the copper alloy is 90 wt % or more) as a target. In this case, on the upper surface of the insulating layer 11 which is positioned closer to the target, the lower layer (12_aa_) is formed with a relatively larger thickness, while on the bottom surface of the via opening (11_a_) which is positioned farther from the target, the lower layer (12_aa_) is formed with a relatively smaller thickness. The thickness of the lower layer (12_aa_) formed on the upper surface of the insulating layer 11 is formed larger than the thickness of the lower layer (12_aa_) formed on the inner wall surface of the via opening (11_a_), and also larger than the thickness of the lower layer (12_aa_) formed on the bottom surface of the via opening (11_a_). More specifically, the thickness of the lower layer (12_aa_) formed on the inner wall surface of the via opening (11_a_) can be formed larger than the thickness of the lower layer (12_aa_) formed on the bottom surface of the via opening (11_a_).

Subsequently, an upper layer (12_ab_) is formed by sputtering to cover the lower layer (12_aa_). The upper layer (12_ab_) is formed, for example, by sputtering using copper as a target. In this case, on an upper portion of the upper surface of the insulating layer 11 which is positioned closer to the target, the lower layer (12_aa_) is formed with a relatively larger thickness, while on an upper portion of the bottom surface of the via opening (11_a_) which is positioned farther from the target, the lower layer (12_aa_) is formed with a relatively smaller thickness. The thickness of the upper layer (12_ab_) formed on the lower layer (12_aa_) covering the upper surface of the insulating layer 11 is formed larger than the thickness of the upper layer (12_ab_) formed on the lower layer (12_aa_) covering the inner wall surface of the via opening (11_a_), and also larger than the thickness of the upper layer (12_ab_) formed on the lower layer (12_aa_) covering the bottom surface of the via opening (11_a_). More specifically, the thickness of the upper layer (12_ab_) formed on the lower layer (12_aa_) covering the inner wall surface of the via opening (11_a_) can be formed larger than the thickness of the upper layer (12_ab_) formed on the lower layer (12_aa_) covering the bottom surface of the via opening (11_a_).

Figure 5E:
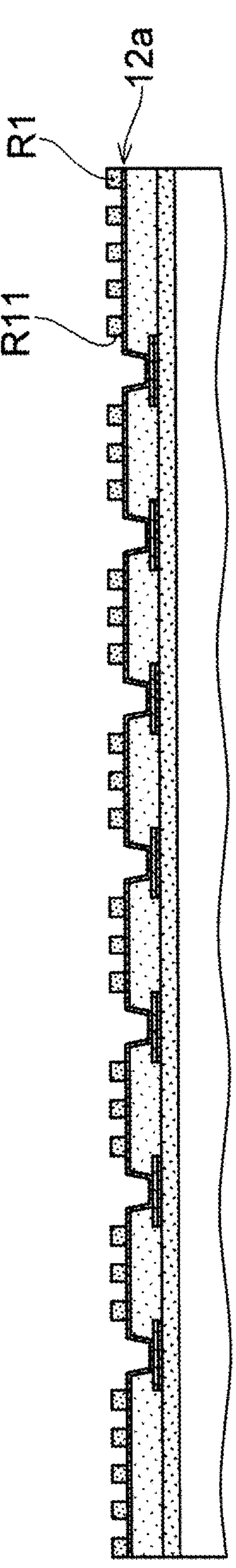
FIG. 5E illustrates an example of a method for manufacturing a wiring substrate according to an embodiment of the present invention.

As illustrated in FIG. 5E, a plating resist (R1) having openings (R11) corresponding to conductor patterns to be formed is provided on the metal film (first layer) (12_a_). In FIGS. 5E-5I, the first layer (12_a_) having the two-layer structure illustrated in FIG. 5D is illustrated as having a single-layer structure for ease of viewing.

Figure 5F:
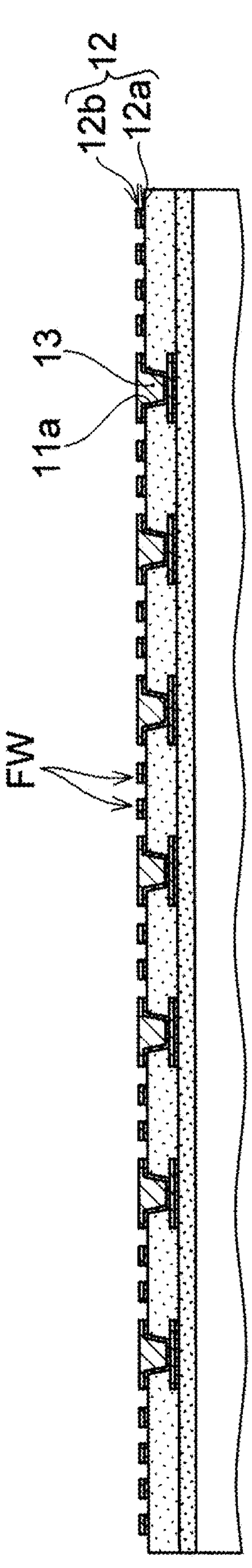
FIG. 5F illustrates an example of a method for manufacturing a wiring substrate according to an embodiment of the present invention.

Subsequently, by electrolytic plating using the first layer (12_a_) as a power feeding layer, a second layer (12_b_), which is an electrolytic plating film layer, is formed in the openings (R11) of the plating resist (R1). Next, after the plating resist (R1) is removed, a portion of the first layer (12_a_) that is not covered by the second layer (12_b_) is removed by etching or the like. As a result, as illustrated in FIG. 5F, a conductor layer 12 that is formed of the first layer (12_a_) and the second layer (12_b_) and includes fine wirings (FW) is formed. Further, via conductors 13 are formed by completely filling the via openings (11_a_) with the second layer (12_b_) which is an electrolytic plating film.

Figure 5G:
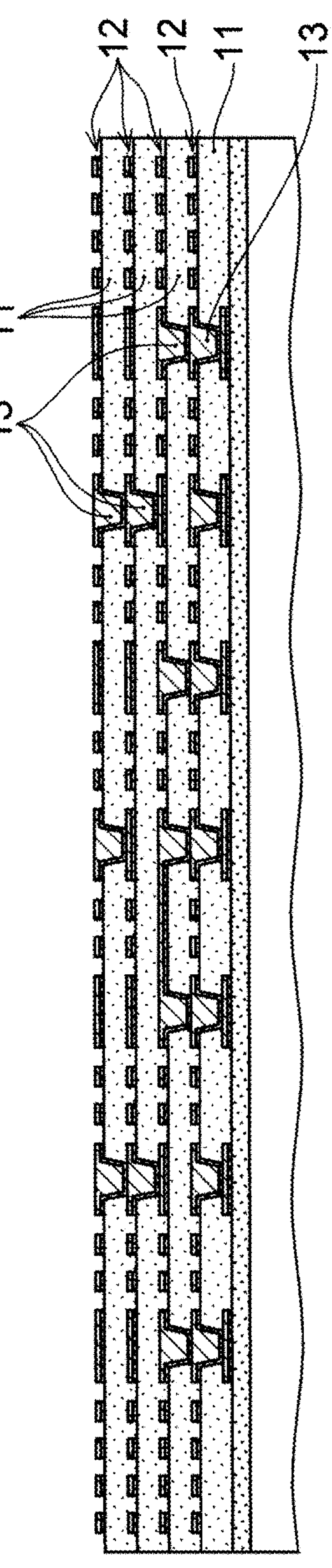
FIG. 5G illustrates an example of a method for manufacturing a wiring substrate according to an embodiment of the present invention.

Subsequently, as illustrated in FIG. 5G, using the same methods as the methods for forming the insulating layer 11, the conductor layer 12 and the via conductors 13 described above, on the conductor layer 12 and the insulating layer 11, a desired number of insulating layers 11 and conductor layers 12, and via conductors 13 penetrating the respective insulating layers, are formed.

Figure 5H:
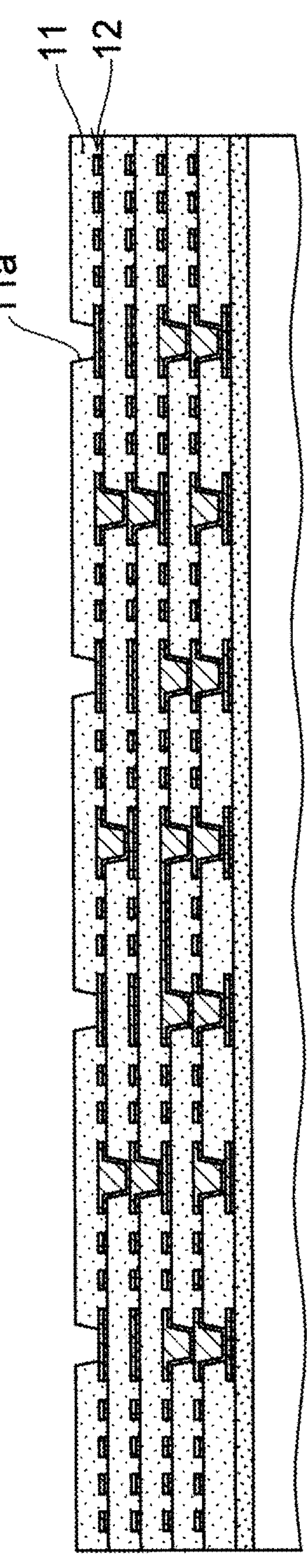
FIG. 5H illustrates an example of a method for manufacturing a wiring substrate according to an embodiment of the present invention.

Next, as illustrated in FIG. 5H, an outermost insulating layer 11 among the insulating layers 11 of the first build-up part 10 (see FIG. 1) is formed on an upper side of the conductor layer 12. After that, via openings (11_a_) for forming via conductors 13 are formed by laser processing in the insulating layer 11 at positions corresponding to formation locations of the via conductors 13 (see FIG. 1).

Figure 5I:
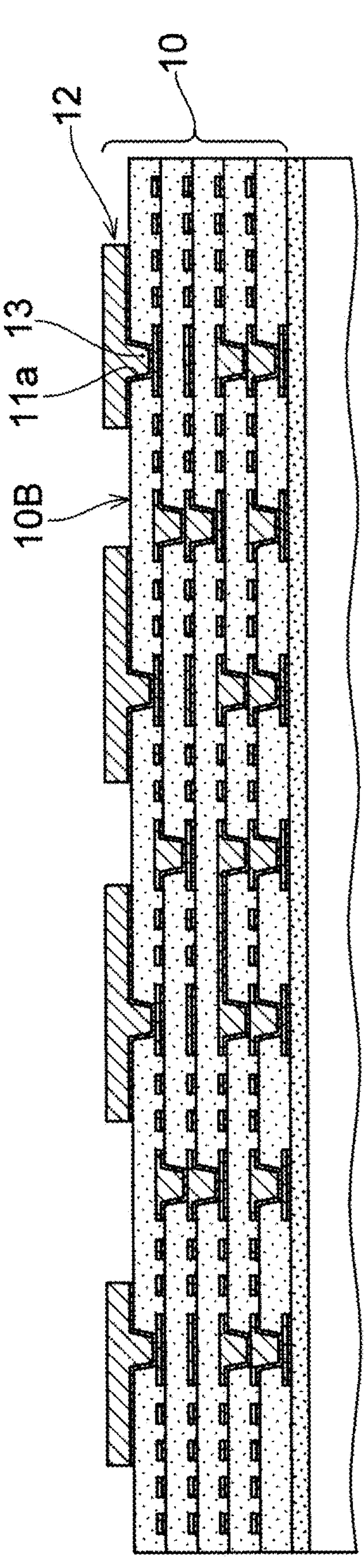
FIG. 5I illustrates an example of a method for manufacturing a wiring substrate according to an embodiment of the present invention.

Subsequently, as illustrated in FIG. 5I, a conductor layer 12 that forms the other surface (10B) is formed simultaneously with the via conductors 13 filling the via openings (11_a_) using any method for forming conductor patterns, such as a semi-additive method. Formation of the first build-up part 10 on the support substrate (GS) is completed.

Figure 5J:
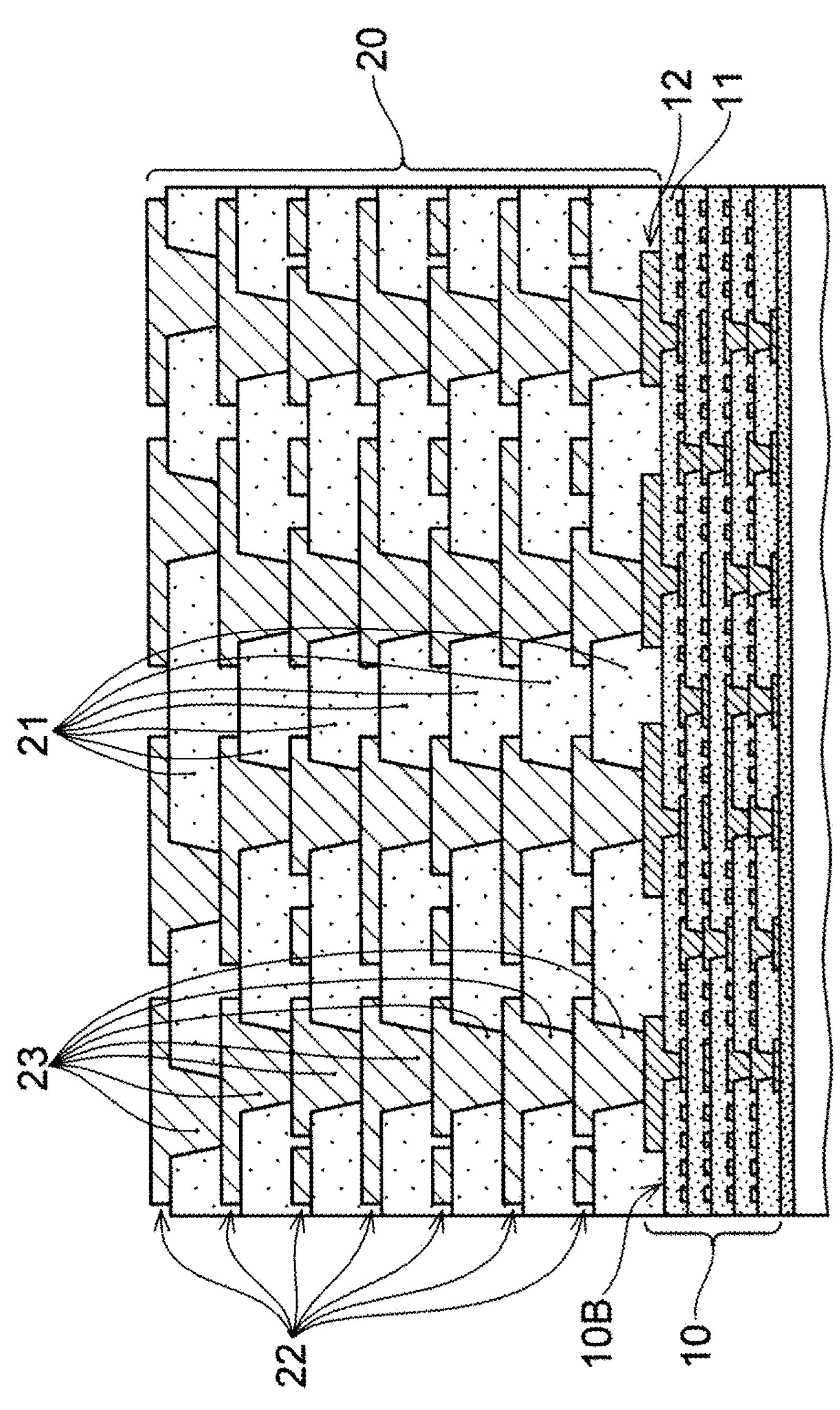
FIG. 5J illustrates an example of a method for manufacturing a wiring substrate according to an embodiment of the present invention.
Figure 5K:
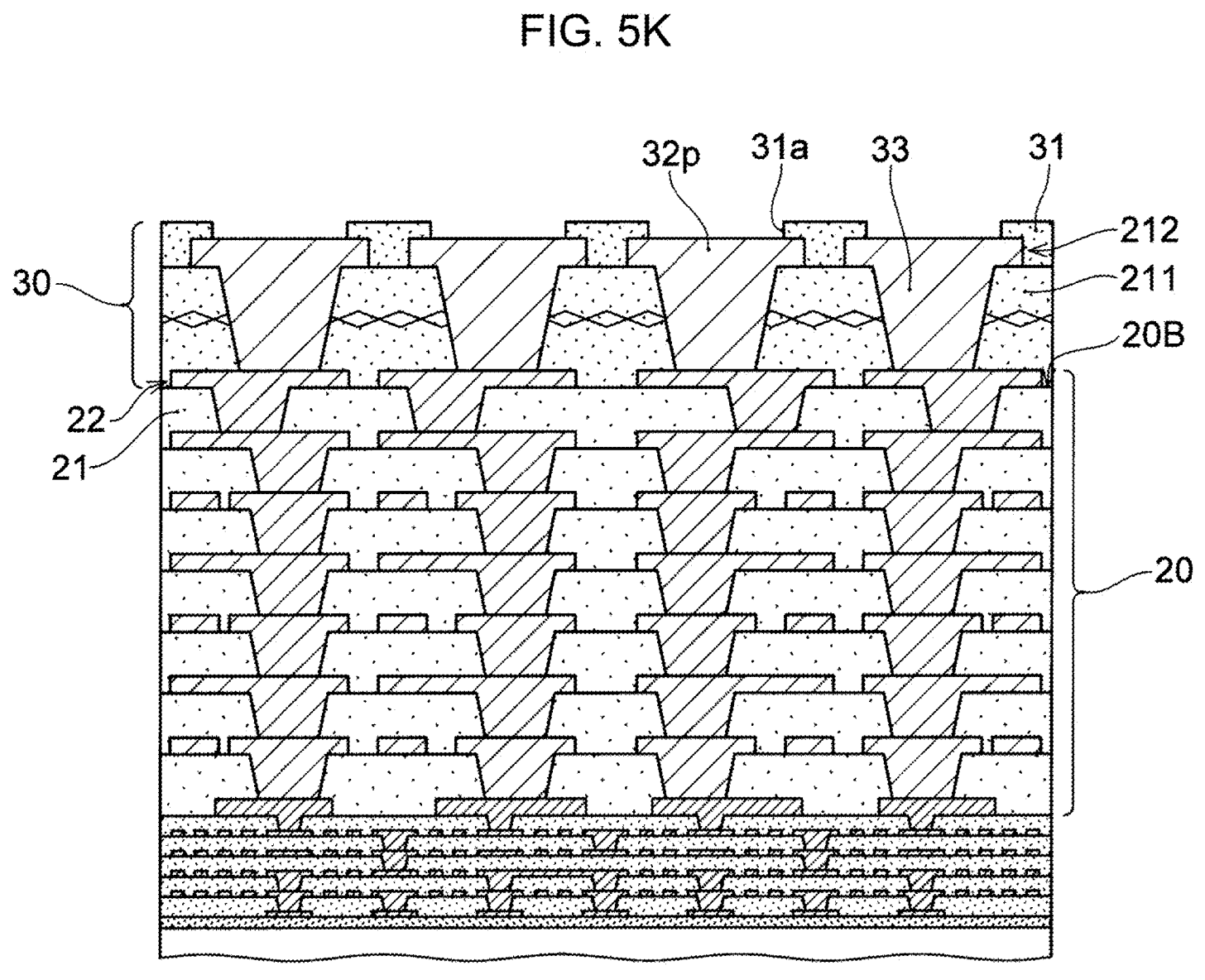
Figure 5L:
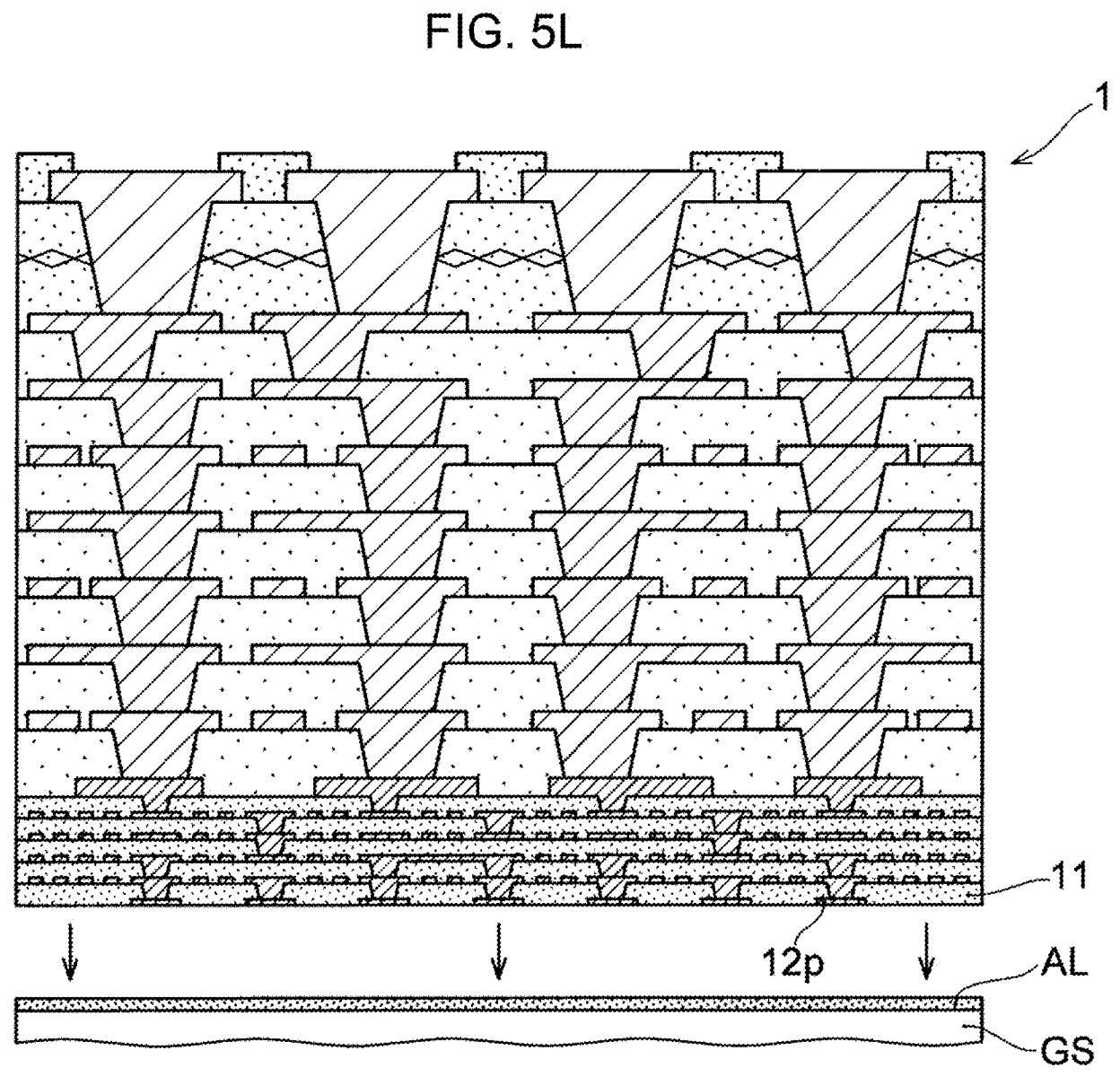

Subsequently, as illustrated in FIG. 5J, the second build-up part 20 is formed on the conductor layer 12 and insulating layer 11 that form the other surface (10B) of the first build-up part 10. An insulating layer 21 can be formed by thermocompression bonding of a film-like resin. A conductor layer 22 can be formed using any method of forming conductor patterns, such as a semi-additive method. A desired number of insulating layers 21 and conductor layers 22 and via conductors 23 penetrating the respective insulating layers 21 are formed. In FIGS. 5J-5L, similar to FIG. 1, the conductor layers are illustrated as each having a single-layer structure.

As illustrated in FIG. 5K, the third build-up part 30 is formed on the insulating layer 21 and conductor layer 22 that form the other surface (20B) of the second build-up part 20. The insulating layer 211, the conductor layer 212, and the via conductors 33 penetrating the insulating layer 211 are formed using the same methods as the methods for forming the insulating layers 21, the conductor layers 22, and the via conductors 23. As an insulating resin forming the insulating layer 211, a prepreg containing an insulating resin such as an epoxy resin or a BT resin impregnated in a reinforcing material (core material) formed of a glass fiber can be used. Next, the solder resist layer 31 is formed by forming a photosensitive epoxy resin or polyimide resin layer on the surfaces of the insulating layer 211 and the conductor layer 212. Then, using a photolithography technology, the openings (31_a_) that respectively define the conductor pads (32_p_) are formed.

Next, as illustrated in FIG. 5L, the support substrate (GS) is removed. The lower surfaces of the conductor pads (12_p_) and the lower surface of the insulating layer 11 are exposed. In removing the support substrate (GS), the adhesive layer (AL) is irradiated with, for example, laser and is softened, and then the support substrate (GS) is peeled off from the conductor pads (12_p_) and the insulating layer 11. The adhesive layer (AL) that can remain on the surfaces of the conductor pads (12_p_) and the insulating layer 11 can be removed by washing. The wiring substrate 1 illustrated in FIG. 1 is completed.

The wiring substrate of the embodiment is not limited to those having the structures illustrated in the drawings and those having the structures, shapes, and materials exemplified herein. As described above, the build-up parts included in the wiring substrate of the embodiment can each have any number of insulating layers and conductor layers. Further, the method for manufacturing the wiring substrate of the embodiment is not limited to the method described with reference to FIGS. 5A-5L, and the conditions, processing order, and the like of the method can be arbitrarily modified. It is also possible that a specific process is omitted or another process is added. For example, a plating layer including a nickel layer and a tin layer may be formed on the surfaces of the conductor pads (12_p_) exposed after the support substrate (GS) is removed.

Japanese Patent Application Laid-Open Publication No. 2000-124602 describes a printed wiring board that includes a conductor layer, a resin insulating layer that covers the conductor layer, a conductor circuit that is formed on the resin insulating layer and a via hole that penetrates the resin insulating layer and connects the conductor circuit and the conductor layer. The conductor circuit includes a layer that includes an alloy layer, which is in contact with the resin insulating layer, and an electroless copper plating film, and a layer formed of an electrolytic copper plating film formed on the electroless copper plating film.

It is thought that, in the printed wiring board described in Japanese Patent Application Laid-Open Publication No. 2000-124602, there may be cases where it is undesirable in terms of suppressing disconnection between the via hole and the conductor layer.

A wiring substrate according to an embodiment of the present invention has a first surface and a second surface on opposite side with respect to the first surface, and includes: a first build-up part that includes alternately laminated first insulating layers and first conductor layers, and first via openings penetrating the first insulating layers, and first via conductors filling the first via openings; and a second build-up part that includes alternately laminated second insulating layers and second conductor layers. The first build-up part is laminated on the first surface side of the second build-up part. A minimum wiring width of wirings included in the first conductor layers is smaller than a minimum wiring width of wirings included in the second conductor layers. A minimum inter-wiring distance of the wirings included in the first conductor layers is smaller than a minimum inter-wiring distance of the wirings included in the second conductor layers. The first conductor layer and the first via conductors include a first layer and a second layer, the first layer covering a surface of the first insulating layer and covering inner wall surfaces and bottom surfaces of the first via openings, and the second layer being formed on the first layer. The first layer includes a first portion on the surface of the first insulating layer, a second portion on the inner wall surfaces of the first via openings, and a third portion on the bottom surfaces of the first via openings. A thickness of the first layer in the first portion is larger than a thickness of the first layer in the second portion, and also larger than a thickness of the first layer in the third portion.

According to an embodiment of the present invention, the first layer in the second portion and third portion is relatively thin, so it may be possible that peeling between the first via conductors and the bottom surfaces of the first via openings due to a stress is suppressed. A wiring substrate having via conductors with good connection reliability can be provided.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate, comprising:

a first build-up part comprising a plurality of first insulating layers, a plurality of first conductor layers, and a plurality of via conductors; and a second build-up part comprising a plurality of second insulating layers and a plurality of second conductor layers and formed such that the first build-up part is laminated on the second build-up part, that a minimum wiring width of wirings in the first conductor layers is smaller than a minimum wiring width of wirings in the second conductor layers, and that a minimum inter-wiring distance of the wirings in the first conductor layers is smaller than a minimum inter-wiring distance of the wirings in the second conductor layers, wherein each of the first conductor layers and via conductors includes a first layer and a second layer formed on the first layer such that the first layer includes a first portion covering a respective surface of the first insulating layers, a second portion covering an inner wall surface in a respective via opening in the first insulating layers, and a third portion covering a bottom surface in the respective via opening in the first insulating layers and that a thickness of the first layer in the first portion is larger than a thickness of the first layer in the second portion and larger than a thickness of the first layer in the third portion.

2. The wiring substrate according to claim 1, wherein the first build-up part is formed such that the wirings in the first conductor layers have an aspect ratio in a range of 2.0 to 4.0.

3. The wiring substrate according to claim 1, wherein the first build-up part is formed such that the wirings in the first conductor layers have a minimum wiring width of 3 μm or less and that the wirings in the first conductor layers have a minimum inter-wiring distance of 3 μm or less.

4. The wiring substrate according to claim 1, wherein the first conductor layers and via conductors in the first build-up part are formed such that a thickness of the first layer in the second portion is larger than a thickness of the first layer in the third portion.

5. The wiring substrate according to claim 1, wherein the first layer in the first conductor layers and via conductors in the first build-up part includes a lower layer and an upper layer covering the lower layer such that the lower layer is in contact with the respective surface of the first insulating layers and the inner wall surface and bottom surface of the respective via opening, that a thickness of the lower layer in the first portion is larger than a thickness of the lower layer in the second portion and larger than a thickness of the lower layer in the third portion, and that a thickness of the upper layer in the first portion is larger than a thickness of the upper layer in the second portion and larger than a thickness of the upper layer in the third portion.

6. The wiring substrate according to claim 5, wherein the first layer in the first conductor layers and via conductors in the first build-up part such that the thickness of the lower layer in the second portion is larger than the thickness of the lower layer in the third portion and that the thickness of the upper layer in the second portion is larger than the thickness of the upper layer in the third portion.

7. The wiring substrate according to claim 5, wherein the first layer in the first conductor layers and via conductors in the first build-up part such that the lower layer is a sputtered film comprising an alloy comprising copper and that the upper layer is a sputtered film comprising copper.

8. The wiring substrate according to claim 7, wherein the lower layer of the first layer in the first conductor layers and via conductors in the first build-up part has the copper in the alloy in a content of 90 wt % or more.

9. The wiring substrate according to claim 1, wherein the first build-up part is formed such that each of the via conductors is formed in the respective via opening having a shape that is reduced in diameter in a direction from the second build-up part toward the first build-up part.

10. The wiring substrate according to claim 1, wherein the first build-up part is formed such that each of the first conductor layers has a polished surface on a second build-up part side.

11. The wiring substrate according to claim 1, further comprising:

a third build-up part formed on the second build-up part on an opposite side with respect to the first build-up part and comprising a third insulating layer and a third conductor layer.

12. The wiring substrate according to claim 5, wherein the first conductor layers and via conductors in the first build-up part is formed such that the thickness of the first portion of the first layer is in a range of 0.02 μm to 1.0 μm, that the thickness of the second portion of the first layer is in a range of 0.006 μm to 0.6 μm, and that the thickness of the third portion of the first layer is in a range of 0.005 μm to 0.4 μm.

13. The wiring substrate according to claim 1, wherein the first conductor layers and via conductors in the first build-up part is formed such that the thickness of the second portion of the first layer is in a range of 30% to 60% of the thickness of the first portion of the first layer and that the thickness of the third portion of the first layer is in a range of 25% to 40% of the thickness of the first portion of the first layer.

14. The wiring substrate according to claim 2, wherein the first build-up part is formed such that the wirings in the first conductor layers have a minimum wiring width of 3 μm or less and that the wirings in the first conductor layers have a minimum inter-wiring distance of 3 μm or less.

15. The wiring substrate according to claim 2, wherein the first conductor layers and via conductors in the first build-up part are formed such that a thickness of the first layer in the second portion is larger than a thickness of the first layer in the third portion.

16. The wiring substrate according to claim 2, wherein the first layer in the first conductor layers and via conductors in the first build-up part includes a lower layer and an upper layer covering the lower layer such that the lower layer is in contact with the respective surface of the first insulating layers and the inner wall surface and bottom surface of the respective via opening, that a thickness of the lower layer in the first portion is larger than a thickness of the lower layer in the second portion and larger than a thickness of the lower layer in the third portion, and that a thickness of the upper layer in the first portion is larger than a thickness of the upper layer in the second portion and larger than a thickness of the upper layer in the third portion.

17. The wiring substrate according to claim 16, wherein the first layer in the first conductor layers and via conductors in the first build-up part such that the thickness of the lower layer in the second portion is larger than the thickness of the lower layer in the third portion and that the thickness of the upper layer in the second portion is larger than the thickness of the upper layer in the third portion.

18. The wiring substrate according to claim 16, wherein the first layer in the first conductor layers and via conductors in the first build-up part such that the lower layer is a sputtered film comprising an alloy comprising copper and that the upper layer is a sputtered film comprising copper.

19. The wiring substrate according to claim 18, wherein the lower layer of the first layer in the first conductor layers and via conductors in the first build-up part has the copper in the alloy in a content of 90 wt % or more.

20. The wiring substrate according to claim 2, wherein the first build-up part is formed such that each of the via conductors is formed in the respective via opening having a shape that is reduced in diameter in a direction from the second build-up part toward the first build-up part.

* * * * *